LINEARISING CIRCUIT ARRANGEMENTS FOR VOLTAGE-SENSITIVE CAPACITANCE DIODES
Filed July 8, 1968
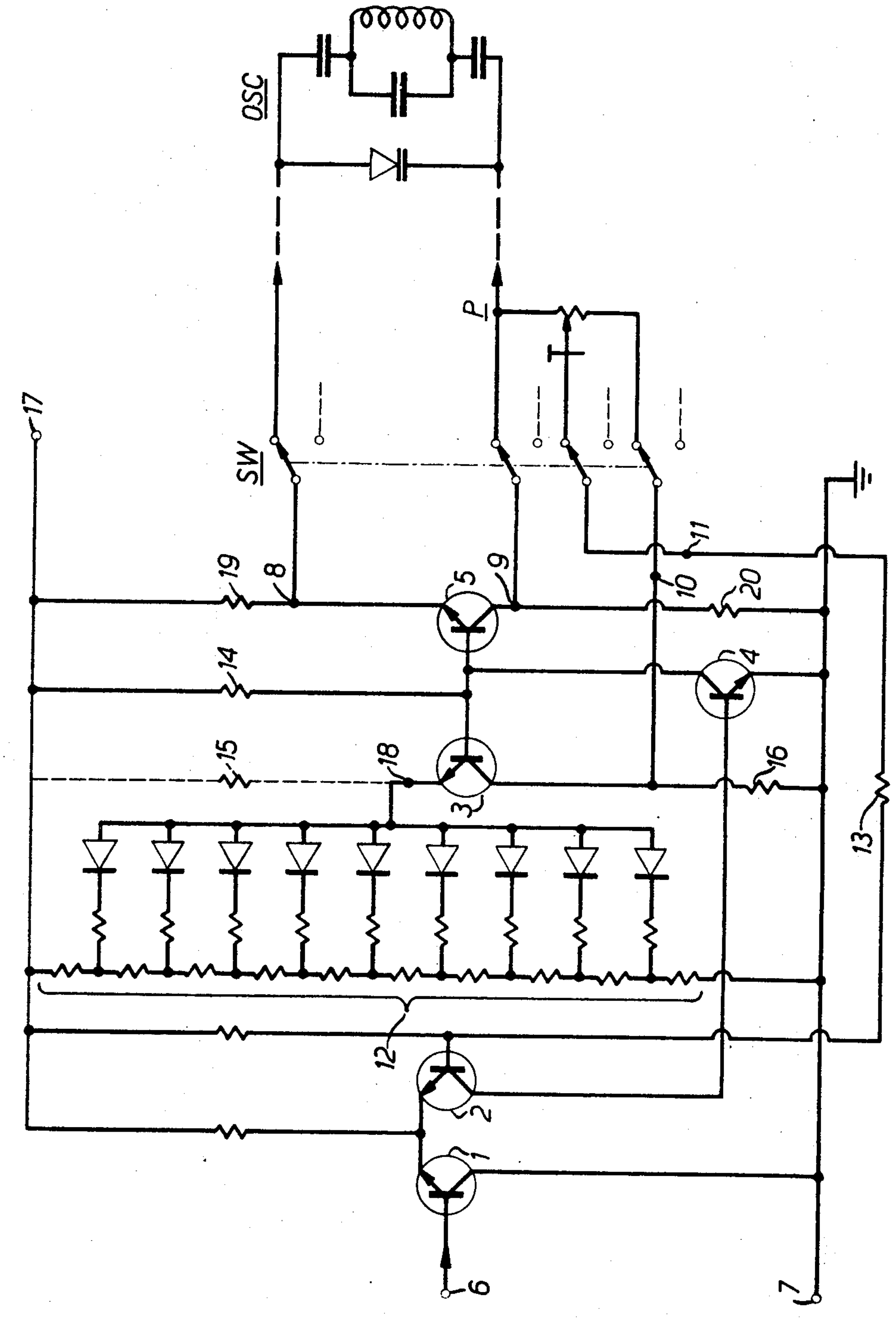
INVENTOR
John Michael Parkyn
BY
Baldwin Wight Diller & Brown
ATTORNEYS United States Patent Office 3,519,954

Patented July 7, 1970

3,519,954

LINEARISING CIRCUIT ARRANGEMENTS FOR VOLTAGE-SENSITIVE CAPACITANCE DIODES

John Michael Parkyn, Hertfordshire, England, assignor to Marconi Instruments Limited, London, England, a British company Filed July 8, 1968, Ser. No. 743,212
Claims priority, application Great Britain, July 10, 1967, 31,685/67
Int. Cl. H03j *3/18*
U.S. Cl. 331—177 4 Claims

ABSTRACT OF THE DISCLOSURE

In an adjustable distorting amplifier for correcting for capacitance/voltage non-linearity in a capacitance diode, input signals are compared with voltage from the variable contact of a variable potentiometer and applied to two phase splitters. One phase splitter has a fixed resistance in each arm, and adjustably distorted output is taken from between their adjacent ends. The other phase-splitter has a fixed resistance in one arm and a voltage-dependent non-linear resistance in its other arm. Voltages across a fixed resistance arm of each phase splitter are applied to the two ends of the potentiometer.

As is well known voltage-sensitive capacitance diodes (which will hereinafter generally be referred to as varactor diodes) as at present available, have a markedly non-linear relationship between capacitance and applied voltage. This non-linear relationship is a serious defect in many practical applications of these diodes and in particular when such a diode is so connected as to provide part of the reactance in the frequency determining circuit of an oscillator in a signal generator in a testing or measuring equipment and is used to produce frequency modulation of the oscillations generated by the oscillator. Because of the non-linear capacitance/voltage characteristic of a varactor diode it is common, when such a diode is employed as above described for frequency modulation, to "underdrive" the diode to a very considerable extent, limiting the modulating voltage applied to the diode to a value which is small in relation with the bias level, so that the applied modulation signal excursions extend over only a small part of the non-linear transfer curve of the diode. The extent of such "underdriving" necessary to achieve acceptably low distortion is quite substantial. To quote practical figures, if the distortion must not exceed 1%, the modulating potential drive to the diode is usually limited to a value such that only about 10% of the frequency change which the diode could produce if non-linearity could be ignored is obtained. This is a serious defect especially in ultra-high frequency working where an ability to drive fully is especially desirable because it is necessary to employ quite loose radio frequency coupling of varactor diodes in order to avoid radio frequency loss and noise.

A known method of reducing the undesired effects of non-linearity in a varactor diode consists in applying correcting distortion to the driving voltage for the diode in order to compensate for, i.e. to correct as far as possible, the distortion due to the non-linear characteristic of the diode itself, and various correcting circuits for this purpose have been proposed. Such correcting circuits as so far known have, however, the defect that they do not provide sufficiently good correction to satisfy practical requirements and/or that they are excessively complex and costly, involving the provision of an unsatisfactorily large number of components in the correcting or distorting circuits. The defect of excessive complexity is particularly serious in cases such as that of a multi-range signal generator for test or calibration purposes, in which it is required to correct for non-linear varactor diode characteristics in a large number of different varactor-diode-modulated oscillators presenting a large number of different non-linear characteristics to be corrected.

The present invention seeks to provide, for correcting for the effects of capacitance/voltage non-linearity in a varactor diode, improved distortion compensating circuit arrangements which shall be simple as compared with known comparable compensating circuit arrangements and shall also be easily adjustable so as to be able to provide an acceptable degree of compensation for non-linearity effects due to any of a wide variety of different non-linear varactor diode capacitance/voltage characteristics.

According to this invention an adjustable distorting amplifier for correcting for the effects of capacitance/voltage non-linearity in a capacitance diode comprises a phase splitting circuit having a fixed resistance in one arm and a voltage dependent non-linear resistance in the other; a second phase splitting circuit having a fixed resistance in each of its two arms; a comparison circuit; means for applying input signals to be distorted to one input side of said comparison circuit and through said comparison circuit to the input points of both phase splitting circuits; a variable potentiometer having one end connected to receive voltage set up across the fixed resistance arm of the first mentioned phase splitting circuit and the other end connected to receive voltage set up across the corresponding fixed resistance arm of the second phase splitting circuit; means for feeding back voltage from the variable contact of said variable potentiometer to the remaining input side of said comparison circuit; and means for taking off adjustably distorted output from between the adjacent ends of the two fixed resistance arms of said second phase splitting circuit.

According to a feature of this invention an adjustable distorting amplifier for correcting for the effects of capacitance/voltage non-linearity in a capacitance diode comprises a first transistor having its emitter connected to a source of operating potential through a voltage-dependent non-linear resistance and its collector connected to a point of anchored potential through a fixed resistance of value at least approximately equal to the mean value of the non-linear resistance; a second transistor having its emitter connected to said operating potential source and its collector connected to said anchored potential point through substantially equal fixed resistances; third and fourth transistors connected as a long tailed pair with their emitters connected together; means for applying input signals to be distorted to the base of said third transistor; means for driving the bases of said first and second transistors from the collector of said fourth transistor; a variable potentiometer having its resistance connected between the collectors of the first and second transistors and its variable contact connected to supply feedback to the base of said fourth transistor; and means for taking off adjustably distorted output signals from between the emitter and collector of said second transistor.

Preferably the non-linear resistance is constituted by a network consisting of a plurality of diodes connected together on one side and each having its other side connected through a separate resistance to a different tapping on a further resistance.

Preferably, in order to enable any of a plurality of differently distorted outputs to be selected at will there is provided a corresponding plurality of variable potentiometers and a selector switch adapted, in each of its different positions, to select a different potentiometer for connection of its variable contact to supply feedback and its ends to receive the voltages from which the variable voltage fed back is derived.

The invention is illustrated in the accompanying drawings which shows one embodiment diagrammatically.

The distorting circuit shown in the drawing is presumed to be incorporated in a signal generator producing frequency modulated signals for testing or measuring purposes and is adjustable so as to be able to provide acceptably good correction for non-linearity in any of a plurality of varactor diodes each connected to modulate the oscillation frequency of a different oscillator any of which may be selected for connection to the distorting circuit by a selector switch the operating handle of which is indicated by a chain line. The switch, which is given the general reference SW may have any number of sets of contacts (depending on the number of selectable oscillators) though for simplicity of drawing, only two sets and only one oscillator, given the general reference OSC are indicated, this oscillator being represented in the figure only by its frequency determining circuit which includes the varactor diode. As will be apparent later distortion adjustment is effected by adjustment is effected by adjustment of a potentiometer, referenced P, there being one such potentiometer, also selectable by the switch SW, for each varactor diode for which compensating correction is required. Again, however, in order to simplify the drawing, only one potentiometer P is shown.

Transistors 1 and 2 constitute 2 so-called "long-tailed pair" and serve to compare the input voltage, presumed to be A.C. superimposed upon D.C. and applied at terminal 6, with part of the output voltage fed back over a feed-back path 13. To quote practical figures the input at 6 may be such that the base of transistor 1 has a mean potential of 10 volts and a peak-to-peak signal swing of 2.5 volts. Input signals applied at terminal 6 pass through the emitters of transistors 1 and 2 and are applied, amplified and uninverted, from the collector of transistor 2 to the base of transistor 4 to appear further amplified and inverted across the resistance 14 in the collector circuit of said transistor 4, being applied to the bases of two transistors 3 and 5. Transistor 5 forms part of a phase splitting circuit including equal resistances 19 and 20 in the circuits of its emitter and collector respectively, these electrodes constituting the output terminals, indicated by references 8 and 9 of the whole distorting circuit arrangement. Connected to the emitter of transistor 3 is a diode-resistance network of a form well known per se which will exhibit an overall resistance dependent on the voltage drop between the supply terminal 17 and the emitter of transistor 3 i.e. the point 18. The network 12 is thus equivalent to a voltage-dependent non-linear resistance connected between point 17 and 18 and, in order to make the circuit easier to understand, this equivalent non-linear resistance is indicated in broken lines and referenced 15. In the collector circuit of the transistor 3 is a resistance 16 and the elements in the network 12 are so chosen that the main value of the overall resistance exhibited thereby, i.e. the mean value of the equivalent non-linear resistance 15, is about equal to the mean value of the resistance 16. Between the collectors of the transistors 5 and 3 i.e. between the points 9 and 10, is connected (through the appropriate contacts of the switch SW) the resistance of the potentiometer P the variable contact or slider of which is connected, also through the switch SW to the point 11 which is one end of the feed back path 13 leading to the base of the transistor 2. As will be apparent, in one extreme position of its slider, the potentiometer P in effect connects the points 9 and 11 together: in the other extreme position it connects the points 10 and 11 effectively together.

The operation is as follows: Suppose, for the moment, that the feedback path 13 is open circuited. Then input signals from 6, fed through the emitters of transistors 1 and 2, and thence via transistor 4 to appear in inverted form across resistance 14, are applied to the base of transistor 5 to appear as a balanced undistorted signal between points 8 and 9. With an undistorted signal (from across resistance 14) applied to the base of transistor 3, the presence of the non-linear network 12 will cause a distorted emitter current to flow due to emitter follower action and an undistorted voltage will be maintained across said network 12. Also the distorted emitter-collector current of transistor 3 will produce a distorted voltage across resistance 16. Now suppose the imaginary open circuit in the feedback path 13 to be removed and consider the action of this path if the potentiometer P is set to that extreme position of adjustment in which the points 9 and 11 are effectively connected together. In this condition of operation the overall amplifier gain is reduced and stabilised by the feedback but the action of the amplifier is still linear because the feedback is taken directly from the output voltage. Comparison between the input voltage and part of the output voltage of course takes place in the "long tailed pair" of transistors 1 and 2. If now the potentiometer P is adjusted to its other extreme position in which points 10 and 11 are effectively connected together, negative feedback is taken from across the resistance 16 and will cause the voltage across this resistance to be a linear replica of the input voltage at terminal 6. It will be seen that this necessarily involves that the voltage at the base of transistor 3 (and, of course, at the base of transistor 5 also) will follow a distorted wave form which will appear at the emitter and be distorted in such manner as to cause a linear current to flow through the network 12. The appearance of this distorted voltage at the base of the transistor 5 also will cause a balanced version of said voltage to appear between the output points 8 and 9 and this is applied via the switch SW across the varactor diode for the non-linearity of which correction is required. As will now be apparent the extent of distortion in the voltage appearing at the output points 8 and 9 can be adjusted by adjustment of the potentiometer P. between a minimum when the potentiometer connects points 9 and 11 together, to a maximum when the said potentiometer connects points 10 and 11 together. The values of the various components in the arrangement are chosen in such manner in accordance with known principles, that adjustment of the potentiometer P adjusts the linearity of the amplifier without changing, at any rate to any practical extent, the peak-to-peak output voltage corresponding to a given input voltage. The temperature stability of the whole arrangement is good and although it incorporates only one non-linear network, acceptably good compensating distortion to suit any of a large number of varactor diode frequency modulated oscillators can be obtained by adjusting the potentiometer P which, with the corresponding oscillator OSC, is selected by the switch SW.

I claim:

1. An adjustable distorting amplifier for correcting for the effects of capacitance/voltage non-linearity in a capacitance diode said amplifier comprising a phase splitting circuit having a fixed resistance in one arm and a voltage dependent non-linear resistance in the other; a second phase splitting circuit having a fixed resistance in each of its two arms; a comparison circuit; means for applying input signals to be distorted to one input side of said comparison circuit and through said comparison circuit to the input points of both phase splitting circuits; a variable potentiometer having one end connected to receive voltage set up across the fixed resistance arm of the first mentioned phase splitting circuit and the other end connected to receive voltage set up across the corresponding fixed resistance arm of the second phase splitting circuit; means for feeding back voltage from the variable contact of said variable potentiometer to the remaining input side of said comparison circuit; and means for taking off adjustably distorted output from between the adjacent ends of the two fixed resistance arms of said second phase splitting circuit.

2. An adjustable distorting amplifier for correcting for the effects of capacitance/voltage non-linearity in a capacitance diode said amplifier comprising a first transistor having its emitter connected to a source of operating potential through a voltage-dependent non-linear resistance and its collector connected to a point of anchored potential through a fixed resistance of value at least approximately equal to the mean value of the non-linear resistance; a second transistor having its emitter connected to said operating potential source and its collector connected to said anchored potential point through substantially equal fixed resistances; third and fourth transistors connected as a long tailed pair with their emitters connected together; means for applying input signals to be distorted to the base of said third transistor; means for driving the bases of said first and second transistors from the collector of said fourth transistor; a variable potentiometer having its resistance connected between the collectors of the first and second transistors and its variable contact connected to supply feedback to the base of said fourth transistor; and means for taking off adjustably distorted output signals from between the emitter and collector of said second transistor.

3. An amplifier as claimed in claim 1 wherein the non-linear resistance is constituted by a network consisting of a plurality of diodes connected together on one side and each having its other side connected through a separate resistance to a different tapping on a further resistance.

4. An amplifier as claimed in claim 1 wherein in order to enable any of a plurality of differently distorted outputs to be selected at will there is provided a corresponding plurality of variable potentiometers and a selector switch adapted, in each of its different positions, to select a different potentiometer for connection of its variable contact to supply feedback and its ends to receive the voltages from which the variable voltage fed back is derived.

References Cited

UNITED STATES PATENTS 3,353,117 11/1967 Renkowitz ---------- 331—36

JOHN KOMINSKI, Primary Examiner

U.S. Cl. X.R.

331—36; 334—15